US012609689B2

(12) United States Patent
Pelicia et al.

(10) Patent No.: US 12,609,689 B2
(45) Date of Patent: Apr. 21, 2026

(54) HYSTERETIC COMPARISON CIRCUIT

(71) Applicant: NXP USA, Inc., Austin, TX (US)

(72) Inventors: Marcos Mauricio Pelicia, Austin, TX (US); Vivek Reddy Nandyala, Austin, TX (US); Edevaldo Pereira da Silva, Jr., Austin, TX (US)

(73) Assignee: NXP USA, Inc., Austin, TX (US)

( * ) Notice: Subject to any disclaimer, the term of this patent is extended or adjusted under 35 U.S.C. 154(b) by 140 days.

(21) Appl. No.: 18/790,519

(22) Filed: Jul. 31, 2024

(65) Prior Publication Data

US 2026/0039285 A1 Feb. 5, 2026

(51) Int. Cl.
H03K 5/24 (2006.01)
H03K 3/037 (2006.01)
H02M 3/158 (2006.01)

(52) U.S. Cl.
CPC ......... H03K 5/2481 (2013.01); H03K 3/0377 (2013.01); *H02M 3/158* (2013.01)

(58) Field of Classification Search
CPC .. H03K 3/023; H03K 3/0233; H03K 3/02337; H03K 3/0377; H03K 3/13; H03K 3/2893; H03K 3/3565
USPC ............................ 327/1, 2, 7, 50, 77, 90, 97
See application file for complete search history.

(56) References Cited

U.S. PATENT DOCUMENTS

| | | | |
|---|---|---|---|
| 5,528,185 A | 6/1996 | Lewicki et al. | |
| 6,940,329 B2 | 9/2005 | Tsai et al. | |
| 9,768,761 B2 | 9/2017 | Huang et al. | |
| 11,626,868 B1 | 4/2023 | Chang | |
| 12,255,650 B2 * | 3/2025 | Chen ................... | H03F 3/45273 |
| 12,316,330 B2 * | 5/2025 | Lee .................... | H03K 3/02337 |

FOREIGN PATENT DOCUMENTS

JP          2-301213 A     12/1990

* cited by examiner

*Primary Examiner* — Hai L Nguyen
(74) *Attorney, Agent, or Firm* — Joanna G. Geld

(57) ABSTRACT

A hysteretic comparison circuit includes a comparator which receives a first input voltage at a control electrode of a first transistor in a first current branch and a second input voltage at a control electrode of a second transistor in a second current branch, and alternately operates in first and second phases. The comparator provides a single output voltage. A latch is coupled to receive the single output voltage and latches a first indicator which indicates, during the first phase, an under voltage event when the first input voltage falls below a first threshold voltage, and latches a second indicator which indicates, during the second phase, an over voltage event when the first input voltage exceeds a second threshold voltage. A first bias current is provided to the comparator during the first phase, and a larger second bias current is provided during the second phase but not the first phase.

20 Claims, 6 Drawing Sheets

HYSTERETIC COMPARISON CIRCUIT

BACKGROUND

Field

This disclosure relates generally to integrated circuits, and more specifically, to a hysteretic comparison circuit.

Related Art

Many applications require the use of a hysteretic comparator, which sets different thresholds for low-to-high transitions and high-to-low transitions, to avoid multiple transitions in the presence of noise. A hysteretic comparator is typically implemented using multiple comparators with different references to create the hysteresis. For example, one application for hysteretic comparators is in switched inductor buck converters (e.g. DCDC converters) in which one comparator detects an under voltage (UV) event when the DCDC output voltage falls below a low threshold, while a second comparator detects an over voltage (OV) event when the DCDC output voltage goes above a high threshold, in which the low and high thresholds are separated by an offset which provides the hysteresis. In many applications, UV and OV event detectors require different accuracy and response times to satisfy electrical specifications. Moreover, low power control circuits pose additional challenges for hysteretic control designs, requiring low quiescent currents while maintaining tight delay and accuracy constraints. While production trimming may address some of these constraints, these converters are usually part of the power up sequence which happen before any trim values are available. Therefore, a need exists for a hysteretic comparator capable of use in low power applications and, if needed, capable of improved untrimmed behavior.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A hysteretic comparator is implemented using a single comparator which has a very low bias current in a monitoring phase for detecting a minimum voltage, but uses an additional hysteresis bias current in a detection phase to create a hysteresis voltage and accelerate the comparator for detecting a peak voltage. The monitoring phase corresponds to a UV detection phase in which detection of the minimum voltage corresponds to a UV event, and the detection phase corresponds to an OV detection phase in which detection of the peak voltage corresponds to an OV event. The hysteretic comparator also includes a latch at the output of single comparator to capture a UV event indicator and an OV event indicator, in which the UV event indicator can be used to control provision of the low bias current and hysteresis bias current to the single comparator. The latch is controlled, based on the UV and OV event indicators, to steer the output of the single comparator to alternately assert the UV and OV event indicators for the monitoring phase and detection phase, respectively. Also, under untrimmed conditions, a trim bias current is used to reduce the hysteresis variation.

Figure 1:
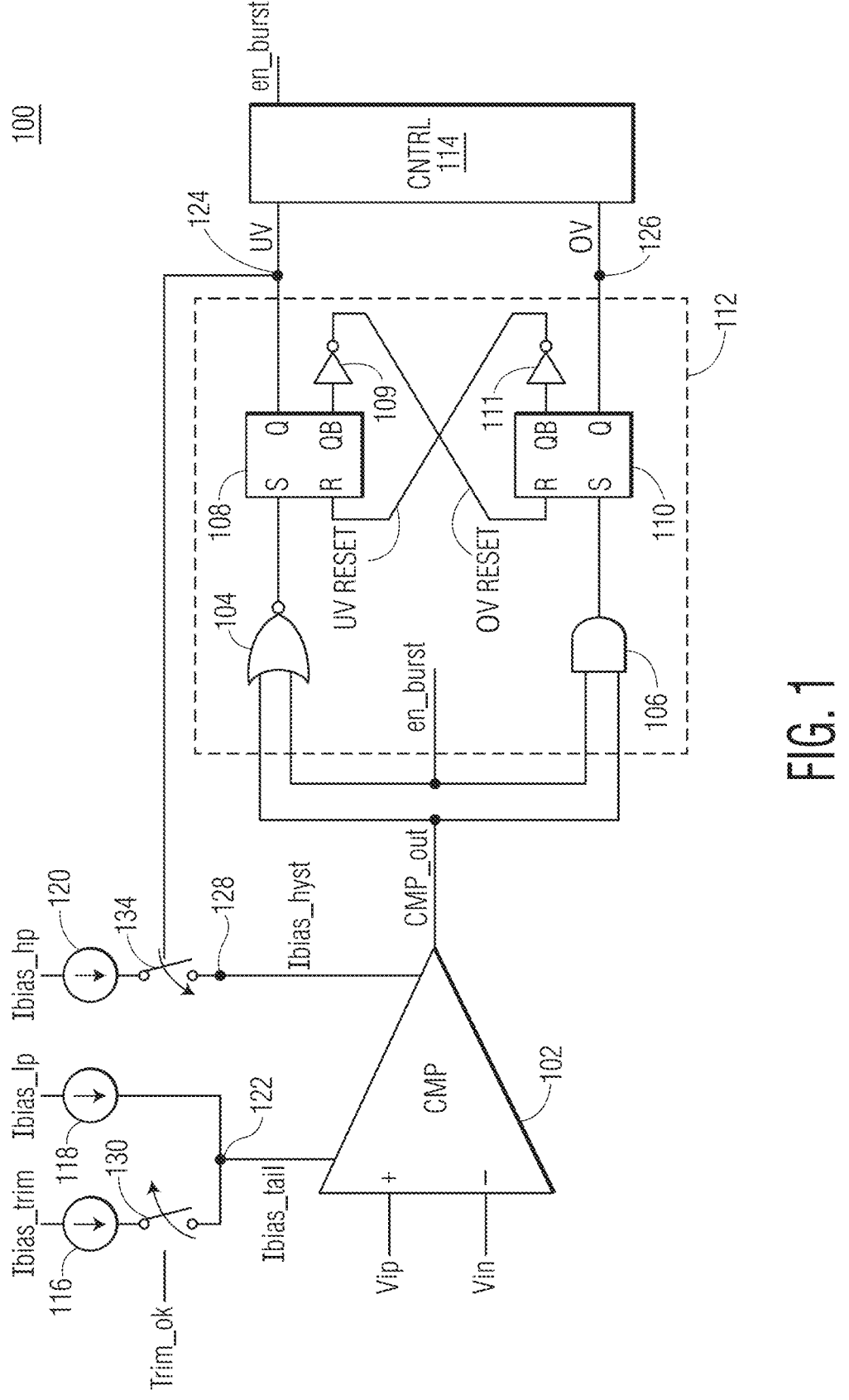
FIG. 1 illustrates, in block diagram form, a hysteretic comparator having a single comparator and a latch which provides a UV event indicator and an OV event indicator, in accordance with one embodiment of the present invention.

FIG. 1 illustrates, in block diagram form, a hysteretic comparator 100, in accordance with one embodiment of the present invention. Hysteretic comparator 100 (also referred to as a hysteretic comparison circuit) includes a single comparator (CMP) 102 coupled to receive a differential input voltage (Vip–Vin). A first input voltage (Vip) of the differential input voltage is received at a non-inverting input of CMP 102, and a second input voltage (Vin) of the differential input voltage is received at an inverting input of CMP 102. CMP 102 is coupled to a circuit node 122 to receive a first bias current, Ibias_tail, and is coupled to a circuit node 128 to receive a second bias current, Ibias_hyst. A current source 116 is configured to provide a trim bias current, Ibias_trim, to circuit node 122 via a switch 130, a current source 118 is configured to provide a low power bias current, Ibias_lp, to circuit node 122, and a current source 120 is configured to provide a high power bias current, Ibias_hp, to circuit node 128 via a switch 134 (in which Ibias_lp<Ibias_hp).

When switch 130 is closed (i.e. conductive or enabled), Ibias_trim is provided to node 122. When switch 130 is open (i.e. non-conductive or disabled), no current is provided through that switch to node 122. In the illustrated embodiment, switch 130 is controlled by a trim control signal Trim_ok, which, when asserted to a logic level one, indicates that trimming is complete and opens switch 130. In this case, Ibias_lp is provided as Ibias_tail. However, when Trim_ok is not active (e.g. negated to a logic level zero), indicating that hysteretic comparator 100 is still untrimmed, switch 130 is closed to provide Ibias_trim as an additional bias current. In this case, "Ibias_lp+Ibias_trim" is provided as Ibias_tail. Therefore, the value of Ibias_tail is dependent upon the state of Trim_ok. Similarly, when switch 134 is closed (i.e. conductive), Ibias_hp is provided as Ibias_hyst. However, when switch 134 is open (i.e. non-conductive), no current is provided as Ibias_hyst (i.e. Ibias_hyst=0).

Hysteretic comparator 100 includes a latch 112 which includes a NOR gate 104, and AND gate 106, and set-reset (SR) latches 108 and 110, inverters 109 and 111, and control circuitry (CNTRL) 114. An output of CMP 102, referred to as CMP_out, is provided to a first input of NOR gate 104 and a first input of AND gate 106, and a control signal, en_burst, is provided to second inputs of NOR gate 104 and AND gate 106. An output of NOR gate 104 is provided to a set (S) input of SR latch 108, and an output of AND gate 106 is provided to an S input of SR latch 110. A Q output of SR latch 108 is provided as a UV event indicator (which may simply be referred to as UV) at a circuit node 124, and a Q output of SR latch 110 is provided as an OV event indicator (which may simply be referred to as OV) at a circuit node 126. A QB output (an inverse of the Q output) of SR latch 108 is coupled to an input of inverter 109, and a QB output of latch 110 is coupled to an input of inverter 111. A reset (R) input of SR latch 110 is coupled to receive a reset signal from an output of inverter 109 (referred to as OV_RESET), and an R input of SR latch 108 is coupled to receive a reset signal from an output of inverter 111 (referred to as UV_RE-SET).

In the illustrated embodiment, each of SR latches 108 and 110 operate in accordance with the following truth table:

| S | R | Q | QB |
|---|---|---|----|
| 0 | 0 | 1 | 0 |
|   |   | 0 | 1 |
| 0 | 1 | 0 | 1 |
| 1 | 0 | 1 | 0 |
| 1 | 1 | 0 | 0 |

Note that, in accordance with this truth table, each SR latch maintains its state when both the S and R inputs are negated to a logic level zero (meaning that each of Q and QB maintain their respective states). When R is asserted to a logic level one and S is at a logic level zero, the output Q is negated (i.e. reset) to a logic level 0, and when S is asserted to a logic level one and R is at a logic level zero, the output Q is asserted (i.e. set) to a logic level one. In both of these cases, QB is provided as the inverse of Q (e.g. QB is a logic level one when Q is reset and a logic level zero when Q is set). However, when both S and R are asserted to logic level ones, both Q and QB are logic level zeros. In one embodiment, the above truth table can be achieved using cross-coupled NOR gates.

Referring back to FIG. 1, latch 112 is therefore coupled to receive CMP_out and en_burst, as inputs, includes gates 104 and 106, SR latches 108 and 110, and inverters 109 and 111, and provides latched values UV and OV as outputs. Note that the single output voltage of CMP 102 (i.e. CMP_out) is used to generate both the latched values of UV and OV, in which NOR gate 104 and AND gate 106 form an input stage of latch 112 which steers CMP_out to affect one of either UV or OV. CNTRL 114 is coupled to circuit nodes 124 and 126 to receive UV and OV, respectively, and provides en_burst based on the values of UV and OV. In one embodiment, in response to UV being asserted to a logic level one, en_burst is also asserted to a logic level one by CNTRL 114, and in response to OV being asserted to a logic level one, en_burst is negated back to a logic level zero by CNTRL 114. Switch 134 is controlled by UV such that when UV is asserted to a logic level one, switch 134 is closed so as to provide Ibias_hyst as Ibias_hp, but when UV is negated to a logic level zero, switch 134 is open such that Ibias_hyst=0.

Figure 2:
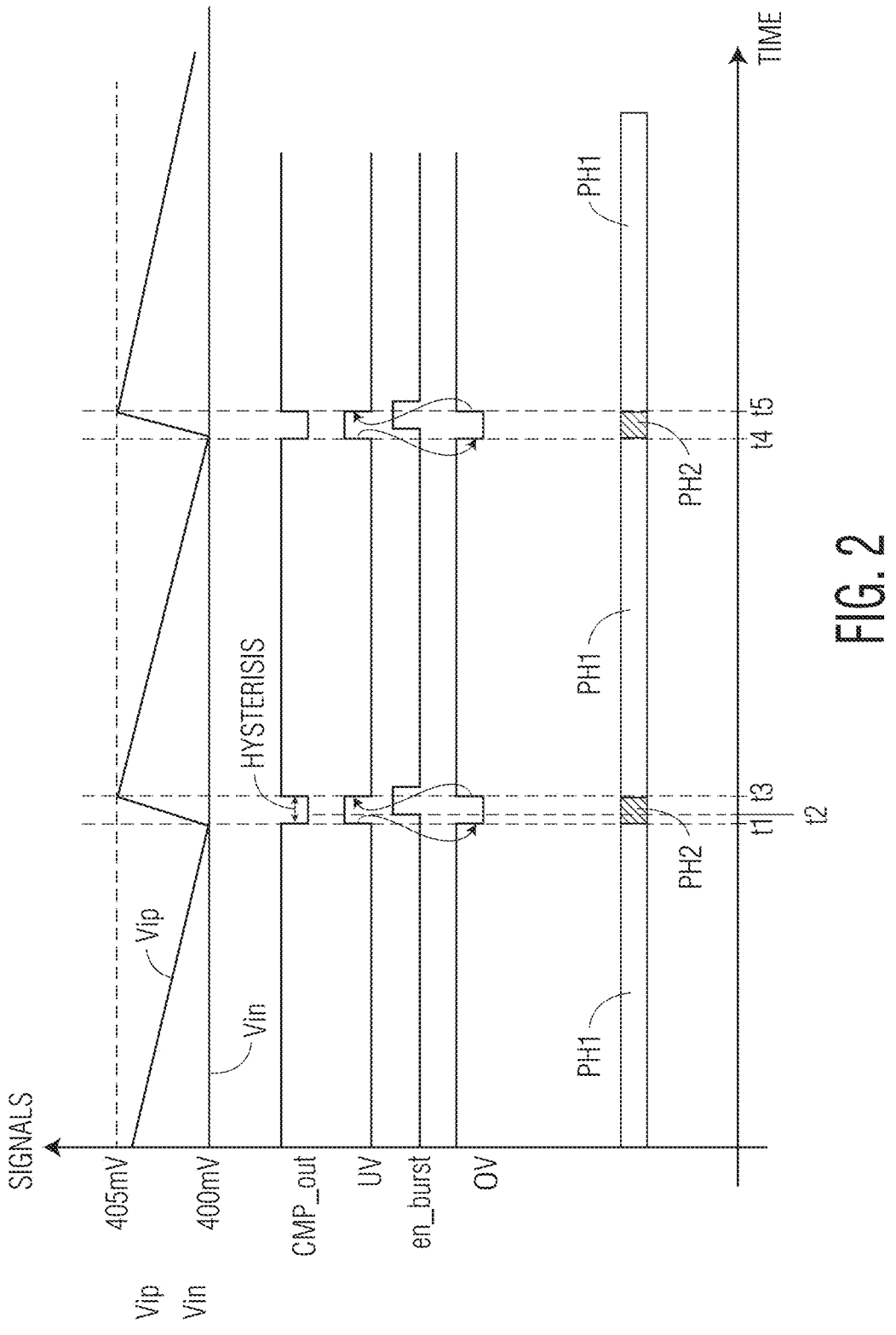
FIG. 2 illustrates various waveforms for some of the signals in the hysteretic comparator architecture of FIG. 1, in accordance with one embodiment of the present invention.

Operation of hysteretic comparator 100 will be described in reference to FIG. 2. FIG. 2 illustrates example waveforms for Vip, Vin, CMP_out, UV, en_burst, and OV in accordance with an embodiment of the present invention. FIG. 2 also labels the comparison phases of hysteretic comparator 100 as PH1 (corresponding to the monitoring phase) and PH2 (corresponding to the detection phase), in which the phase is indicated by the logic state of UV. In the illustrated example, a UV event corresponds to Vip dropping below a low threshold, e.g. 400 mV, and an OV event corresponds to Vip going above a high threshold, e.g. 405 mV (thus providing a hysteresis of about 5 mV). Therefore, CMP_out is asserted at a logic level one while Vip is decreasing towards Vin, but once Vip falls below 400 mV (e.g. Vip−Vin reaches 0), CMP_out is negated (i.e. deasserted) to a logic level zero. Due to the 5 mV hysteresis, CMP_out is not asserted back to a logic level one until Vip goes above 405 mV (e.g. Vip−Vin reaches 5 mV). As will be described in more detail in reference to FIG. 3 below, the hysteresis for CMP 102 is provided by a hysteresis bias current asymmetrically injected, as controlled by UV, into a current branch of CMP 102. The hysteresis bias current is controlled by UV such that it is injected during the higher power detection phase and not during the lower power monitoring phase.

Referring to the waveforms of FIG. 2, beginning before time t1, hysteretic comparator 100 is operation in the monitoring phase (PH1). During the monitoring phase, Vip is greater than Vin (e.g. 400 mV), which drives CMP_out to a logic level one. During this phase, OV and UV_RESET are asserted at a logic level one, UV and OV_RESET are negated at a logic level zero, and en_burst is at a logical level zero. Note that while en_burst is negated at a logic level zero, the output of AND gate 106 remains at a logic level zero, thus preventing (i.e. masking) the S input of SR latch 110 from being asserted to a logic level one. When Vip falls below Vin, CMP_out is deasserted to a logic level zero, driving the first input of NOR gate 104 to a logic level zero. Since en_burst is also at a logic level zero, NOR gate 104 asserts the S input of SR latch 108 to a logic level one. As both the S and R inputs of SR latch 108 are at a logic level one, the QB output transitions to a logic level zero (while Q remains at zero), thus transitioning OV_RESET to a logic level one. As OV_RESET is connected to the R input of SR latch 110 and the S input of SR latch 110 is already at a logic level zero, OV is negated to a logic level zero. This results in transitioning UV_RESET to a logic level zero as well. As the S input of SR latch 108 is at a logic level one and the R input is now at a logic level zero, UV at the Q output is asserted to a logic level one, thereby indicating a UV event (which occurs at time t1). Assuming that hysteretic comparator 100 has been trimmed (thus Trim_ok is at a logic level one), during the monitoring phase, Ibias_lp is provided as Ibias_tail and Ibias_hyst is 0. This results in low power operation during the monitoring phases and does not add any hysteresis on the low-to-high transition of CMP_out. However, once UV is asserted, thus entering the detection phase, switch 134 is closed such that Ibias_hp is provided as Ibias_hyst which is asymmetrically injected into CMP 102.

At time t1, with the assertion of UV, the detection phase begins in which the hysteresis bias current is injected to provide faster (and higher power) operation of CMP 102 as well as add hysteresis. CNTRL 114, at time t2, asserts en_burst to a logic level one. Note that when en_burst is asserted, the output of NOR gate 104 transitions to a logic level zero, thus preventing (i.e. masking) the S input of SR latch 108 from being asserted to a logic level one. With both the S and R input of SR latch 108 being at a logic level zero, the latch enters its memory state (in which the values of Q and QB are not changed) and thus retains the value of UV at a logic level one (and thus OV_RESET at a logic level one). Therefore, with the S input of SR latch 110 at a logic level zero and the R input of SR latch 110 now at a logic level zero, OV remains at a logic level zero (and thus UV_RESET also remains at a logic level zero). At time t3, when Vip reaches 405 mV, CMP_out is asserted back to a logic level one. With en_burst already asserted as well, the S input of latch 110 is also asserted to a logic level one, causing UV_RESET to be asserted to a logic level one, resetting UV and OV_RESET back to a logic level zero. With the S input at a logic level one and the R input at a logic level zero for latch 110, OV is asserted to a logic level one, thus again entering the monitoring phase (PH1). In response to assertion of OV, CNTRL 114 also negates en_burst back to a logic level zero.

Note that the hysteresis provided by the hysteresis bias current is represented by the time between t1 and t3 in which, after the high-to-low transition of CMP_out occurs at time t1 (due to Vip reaching or falling below 400 mV), the low-to-high transition of CMP_out occurs later, at time t3 (due to Vip reaching or going above 405 mV). Note also that the time between t1 and t2 corresponds to the time it takes CNTRL 114 to assert en_burst in response to assertion of UV. During this time (which corresponds to an initial portion of the detection phase), en_burst is still zero which continues to mask any ringing in CMP_out (caused, for example, by the injection of the hysteresis bias current) from affecting OV. As described above, due to masking by AND gate 106, OV at the Q output of SR latch 110 can only be transitioned from a logic level zero to a logic level one in response to CMP_out while en_burst is asserted. Similarly, UV at the Q output of SR latch 108 can only be transitioned from a logic level zero to a logic level one in response to CMP_out while en_burst is negated.

Note that, in alternate embodiments, different logic circuitry can be used to implement the functionality of latch 112. For example, a different input stage can be implemented rather than using NOR gate 104 and AND gate 106 which allows en_burst to appropriately steer CMP_out to affect either UV or OV. Also, different types of latches or logic can be used to implement the latching and reset functions of SR latches 108 and 110. Note also that, in alternate embodiments, OV or en_burst may be used in addition to or instead of UV to control switch 120.

Figure 3:
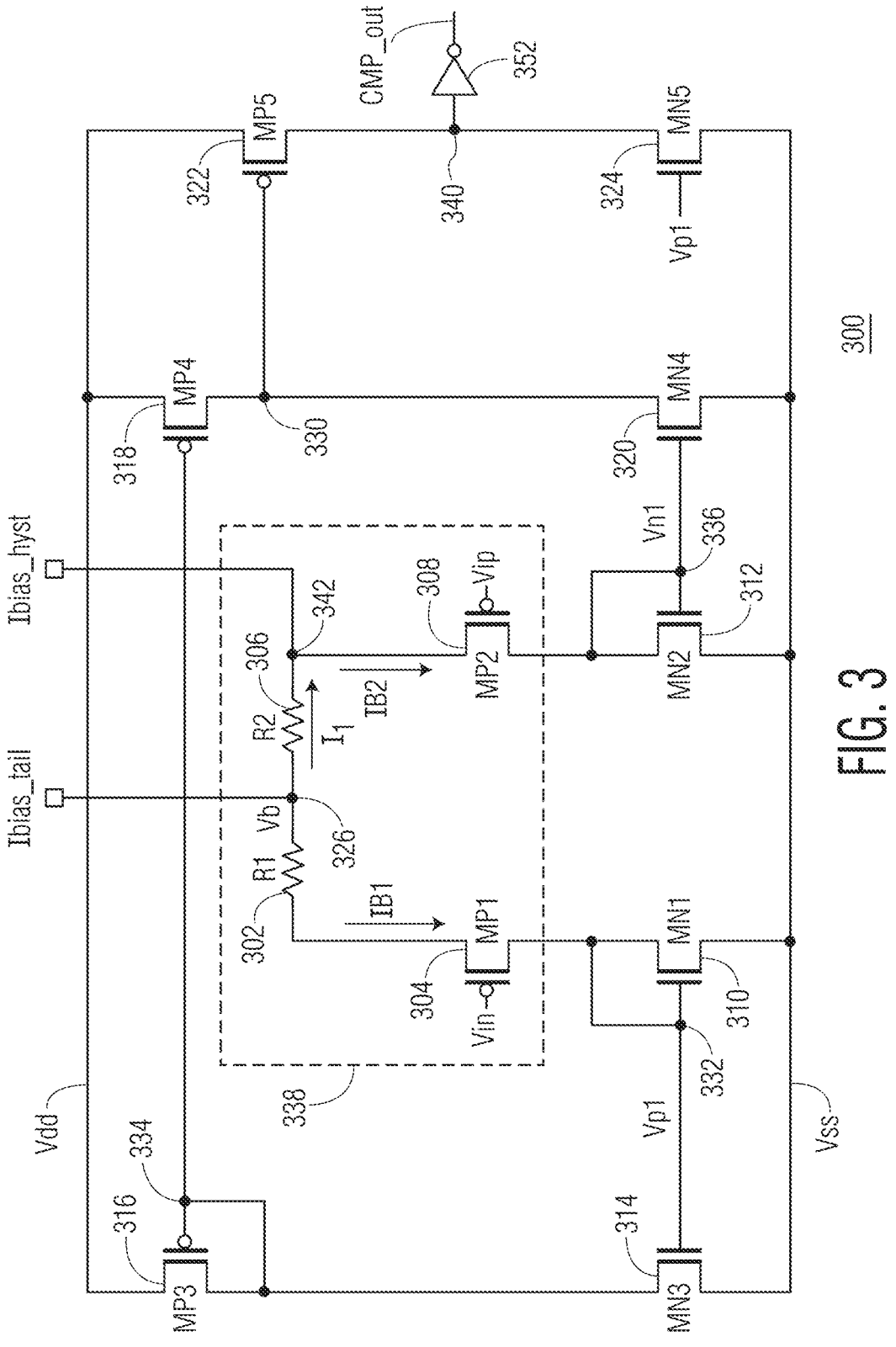
FIG. 3 illustrates, in schematic form, an implementation of a p-channel metal-oxide-semiconductor (PMOS) version of the single comparator of FIG. 1, in accordance with an embodiment of the present invention.

FIG. 3 illustrates, in schematic form, an implementation of a PMOS version of the CMP 102 of FIG. 1, in accordance with an embodiment of the present invention, in which CMP 102 of FIG. 1 can be implemented with CMP 300 of FIG. 3. FIG. 3 includes PMOS transistors MP1 304, MP2 308, MP3 316, MP4 318, and MP5 322 and NMOS transistors MN1 310, MN2 312, MN3 314, MN4 320, and MN5 324, an inverter 352, and a pair of resistors including resistor R1 302 and R2 306. Note that in the descriptions herein, each element may be referred to simply by its letter/number label (e.g. MP1, MN1, R1, etc.). CMP 300 is coupled between a first voltage supply terminal configured to provide a first voltage supply, Vdd, and a second voltage supply terminal configured to provide a second voltage supply, Vss, in which Vdd is greater than Vss. Note that in the descriptions herein, each voltage supply terminal may simply be referred to by the supply voltage it provides (e.g. Vdd and Vss).

R1 has a first terminal coupled to a circuit node 326 and a second terminal coupled to a first current electrode of MP1. MP1 has a control electrode coupled to receive Vip and a second current electrode coupled to a circuit node 332. MN1 has a first current electrode coupled to circuit node 332, a control electrode coupled to circuit node 332, and a second current electrode coupled to Vss. R2 has a first terminal coupled to circuit node 326 and a second current electrode coupled to a circuit node 342. In the illustrated embodiment, R1 and R2 have a same resistance value, R. MP2 has a first current electrode coupled to circuit node 342, a control electrode coupled to receive Vin, and a second current electrode coupled to a circuit node 336. Therefore, circuit node 326 is located between the resistors of the pair of resistors (i.e. between R1 and R2), and circuit node 342 is located between the pair of resistors and MP2 (i.e. between R2 and MP2). MN2 has a first current electrode coupled to circuit node 336, a control electrode coupled to circuit node 336, and a second current electrode coupled to Vss. Circuit node 326 is coupled to receive Ibias_tail and provides a voltage Vb, circuit node 342 is coupled to receive Ibias_hyst, circuit node 332 provides a voltage Vp1, and circuit node 336 provides a voltage Vn1.

MP3 has a first current electrode coupled to Vdd, a control electrode coupled to a circuit node 334, and a second current electrode coupled to circuit node 334. MN3 has a first current electrode coupled to circuit node 334, a control electrode coupled to circuit node 332, and a second current electrode coupled to Vss. MP4 has a first current electrode coupled to Vdd, a control electrode coupled to circuit node 334, and a second current electrode coupled to a circuit node 330 (also referred to as a combination point of CMP 300). MN4 has a first current electrode coupled to circuit node 330, a control electrode coupled to circuit node 336, and a second current electrode coupled to Vss. MP5 has a first current electrode coupled to Vdd, a control electrode coupled to circuit node 330, and a second current electrode coupled to a circuit node 340. MN5 has a first current electrode coupled to circuit node 340, a control electrode coupled to circuit node 332 to receive Vp1, and a second current electrode coupled to Vss. An input of inverter 352 is coupled to circuit node 340 and an output of inverter 352 provides CMP_out.

In operation, R1 and R2 are connected to the source terminals of the input MP1 and MP2 pair forming a source degenerated differential pair configuration. Portion 338 of CMP 300 includes R1, R2, MP1, and MP2 which operates to translate input voltage Vin and Vip into currents, in which portion 338 forms two current branches, one through MP1 and the other through MP2. Circuit node 326 is located symmetrically between the current branches (in which both current branches include a resistance R and a transistor between node 326 and Vss) while circuit node 342 is located asymmetrically between the current branches (in which one branch includes a greater resistance between node 342 and Vss than the other). Therefore, Ibias_tail received at circuit node 326 is provided symmetrically through both branches (split between R1/MP1 and R2/MP2), but Ibias_hyst received at circuit node 342 is provided asymmetrically through the branches (a portion through R2/R1/Mp1 and another portion through MP2). When only Ibias_tail is provided (Ibias_hyst=0), the current down each branch, IB1 and IB2, are the same. However, when Ibias_hyst is not zero, IB1 is not the same as IB2 (from node 342 to Vss), as will be described below. MN1/MN3 and MP3/MP4 operate as current mirrors such that a current proportional to IB1 is provided at circuit node 330, and MN2/MN4 operate as a current mirror such that a current proportion to IB2 is provided at circuit node 330. Therefore, circuit node 330 combines both currents (e.g. adds or subtracts the currents). MP5 and MN5 operate to amplify the combined current to provide CMP_out at the output of inverter 352.

For the descriptions which follow for the monitoring and detection phases with respect to FIGS. 2 and 3, it is assumed that CMP 102 (e.g. CMP 300) has been trimmed (in which the untrimmed behavior of CMP 102 will be described in more detail below, after discussion of FIG. 4). Therefore, referring back to FIG. 2, assuming that trimming has occurred, CMP 102 operates slower and at lower power during the monitoring phases (e.g. while UV is at a logic level zero, such as t3-t4), when Ibias_tail is simply provided as Ibias_lp and Ibias_hyst is 0, as compared to the detection phases (e.g. while UV is at a logic level high, such as t1-t3 and t4-t5), when Ibias_lp is provided as Ibias_tail and Ibias_hp is provided as Ibias_hyst. Therefore, Ibias_lp is the bias current for CMP 102 during the monitoring phases, and "Ibias_lp+Ibias_hp" is the bias current during the detection phases. In one embodiment, Ibias_hp is much greater than Ibias_lp (Ibias_hp>>Ibias_lp, such that Ibias_hp is, e.g., at least 10 times, 20 times, 30 times, or 40 times greater than Ibias_lp) in order to obtain a faster transition during the detection phases. In one embodiment, Ibias_lp is always ON (e.g. always provided to circuit node 326 during both the monitoring and detection phases) while Ibias_hp is enabled to be provided as Ibias_hyst by UV (in which the assertion of UV closes switch 134 to provide Ibias_hp as Ibias_hyst to node 342 and negation of UV results in provided no current as Ibias_hyst). For CMP 102, the different bias conditions (e.g. bias currents) provide for different thresholds for the monitoring and detection phases.

Referring back to FIG. 1, during the monitoring phase, UV is negated to a logic level zero, thus opening switch 134 such that Ibias_hyst is zero. Therefore, the overall bias current through the input stage of CMP 102 at node 326 is Ibias_lp and CMP 102 behaves as having an input pair with degenerated source resistors, and since R1 and R2 have the same resistance, the threshold for a low to high transition of CMP_out can be defined with Equation 1 below:

$$Vth\_low = Vip - Vin = 0$$

During the detection phase, UV is asserted to a logic level one, thus closing switch 134 such that Ibias_hyst is provided as Ibias_hp. Note that Ibias_lp is still flowing into node 326 but in this phase there is an additional contribution from the Ibias_hp current into node 342. The threshold for the high to low transition of CMP_out can be defined by Equation 2 below:

$$Vth\_high = Vip - Vin =$$
$$0.5 * (Ibias\_lp + Ibias\_hp) * R1 - 0.5 * (Ibias\_lp - Ibias\_hp) * R2$$

Considering R1=R2=R, then the threshold can be simplified as in Equation 3 below:

$$Vth\_high = Vip - Vin - Ibias\_hp * R$$

In this case, unlike in Equation 1 above, the threshold is not 0V (i.e. "Ibias_hp*R" is not 0). Therefore, the overall hysteresis of CMP 102, Vhyst, is obtained from the Vth_high and Vth_low trip points, as shown in Equation 4 below:

$$Vhyst = Vth\_high - Vth\_low = Ibias\_hp * R$$

Figure 4:
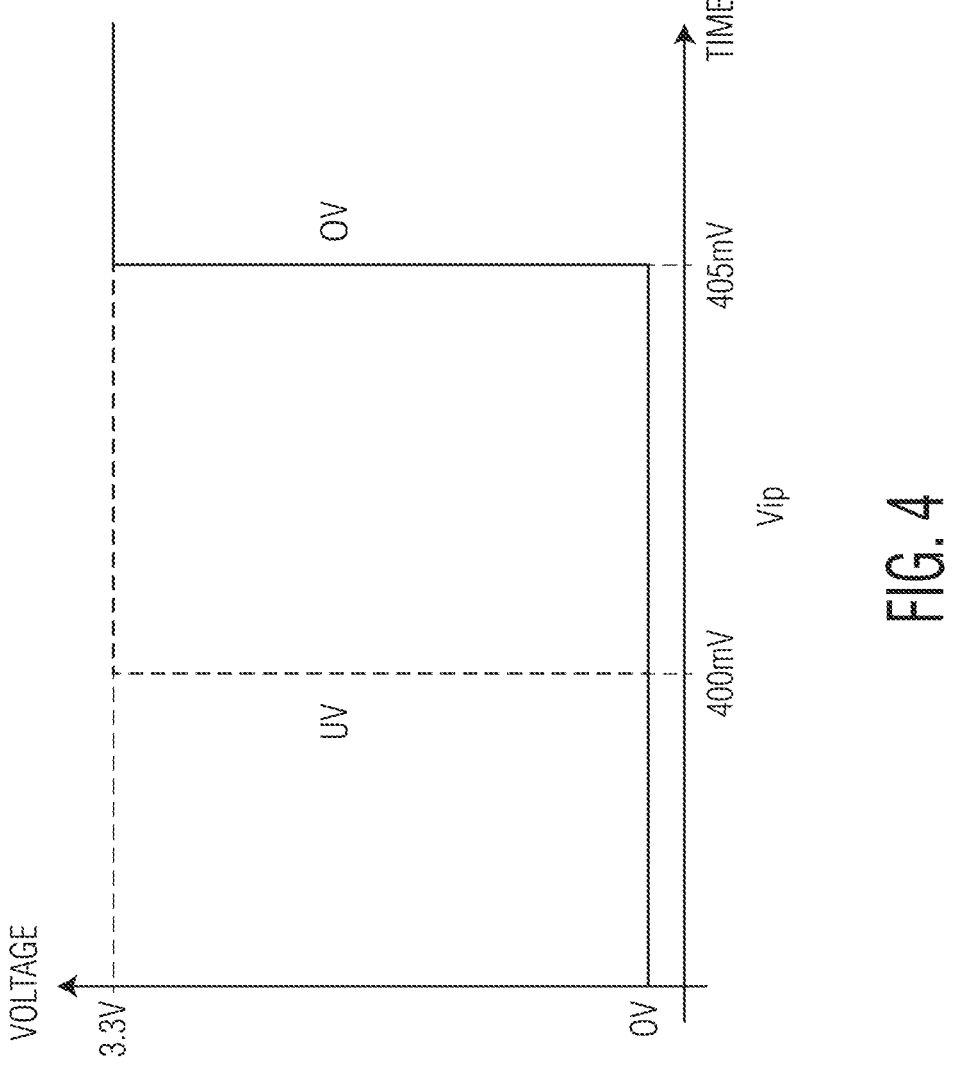
FIG. 4 illustrates example waveforms for the UV and OV event indicators of the hysteretic comparator of FIG. 1, in accordance with an embodiment of the present invention.

This can be seen in the example case illustrated in FIG. 4, which illustrates an example UV detection and OV detection, in accordance with an embodiment of the present invention. For this embodiment, it is assumed that Vdd=3.3V, Vin=400 mV, Ibias_lp=50 nA, Ibias_hp=1.25 uA, and R1=R2=4 kOhm, which results in an expected hysteresis for CMP 102 as 5 mV. Therefore, as seen in FIG. 4 which illustrates the DC characteristics of UV and OV, in the monitoring phase, the UV detection occurs when Vip is 400 mV indicating that Vth_low is 0V, but the OV detection occurs when Vip is 405 mV, indicating that Vth_high is 5 mV, resulting in a hysteresis of 5 mV (Vth_high−Vth_low). Note that the waveforms of FIG. 4 illustrate an example in which comparator 100 is integrated into a voltage regulation loop in which the load is constant and the output capacitor is being charged between UV and OV detections.

Referring back to FIGS. 2 and 3, operation of CMP 102 (and thus CMP 300) will be described with respect to the untrimmed behavior, in which it is assumed that CMP 102 has not yet been trimmed. As illustrated in FIG. 1, note that prior to trimming, Trim_ok is still a logic level zero, which closes switch 130. This results in Ibias_tail being provided as Ibias_trim instead of as Ibias_lp to reduce the difference in offsets between the monitoring and detection phases. That is, since a single comparator (CMP 102, 300) is used to implement hysteretic comparator 100, the different bias currents for the monitoring and detection phases results in a difference in offsets between the phases. For example, Equation 5 below provides the relation between the comparator offsets and its hysteresis, where Voffset_lp_mode and Voffset_hp_mode represent the offsets observed in the comparator at the different bias conditions (Ibias_lp and Ibias_hp, respectively):

$$Vhyst_{untrimmed} = Voffset\_hp\_mode = Voffset\_lp\_mode + Vhyst$$

This offset depends on various factors like bias current, size, threshold voltage mismatch between the input pair MP1 and MP2, and this offset is inversely proportional to the square root of the bias current through the input transistor pair. Therefore, the hysteresis can vary a lot in either of the directions, in which trimming the reference voltage and Ibias_hp currents helps achieve a constant hysteresis. However, before trim bits are applied (while still untrimmed), this trimming compensation cannot be used.

Therefore, in one embodiment, the difference in offsets is reduced by using an additional bias current, Ibias_trim. From Equation 4 above, it can be seen that the hysteresis is not affected by varying Ibias_lp. However, the offset variation is reduced if Ibias_lp is increased to a value similar to that of Ibias_hp (such that the offset for Vhyst_{untrimmed} becomes close to Vhyst). Therefore, the additional bias current, Ibias_trim, is set to be about the same value of Ibias_hp, but is controlled by Trim_ok such that it is only provided as Ibias_tail instead of Ibias_lp when CMP 102 is still untrimmed (when Trim_ok is at a logic level zero). Therefore, in one embodiment, Ibias_trim is provided to node 326 when untrimmed during both monitoring and detection phases (in which Ibias_hp is also provided to node 342 during the detection phases). In this manner, the hysteresis variation is mitigated while untrimmed, and as soon as the trimming bits are loaded, Ibias_trim is disabled. Although there is a penalty of higher power consumption while untrimmed, the untrimmed behavior usually occurs during a power up phase in which the power restriction can be relaxed.

Figure 5:
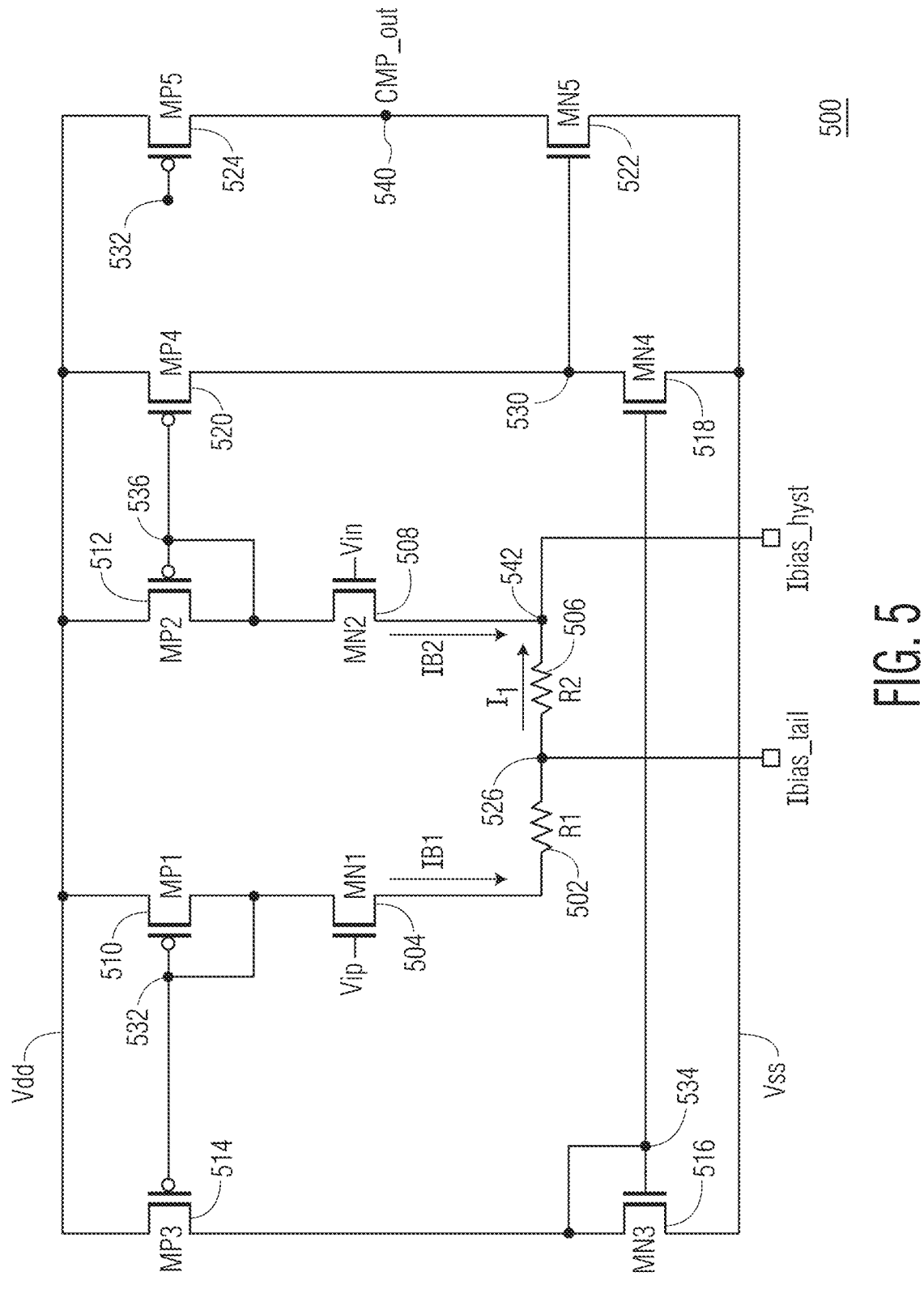
FIG. 5 illustrates, in schematic form, an implementation of an n-channel metal-oxide-semiconductor (NMOS) version of the single comparator of FIG. 1, in accordance with an embodiment of the present invention.

FIG. 5 illustrates, in schematic form, an implementation of an NMOS version of the CMP 102 of FIG. 1, in accordance with an embodiment of the present invention, in which CMP 102 of FIG. 1 can be implemented with CMP 500 of FIG. 5. FIG. 5 includes NMOS transistors MN1 504, MN2 508, MN3 516, MN4 518, and MN5 522 and PMOS transistors MP1 510, MP2 512, MP3 514, MP4 520, and MP5 524, and resistors R1 502 and R2 506. CMP 500 is also coupled between Vdd and Vss. Note that in the descriptions which follow while describing FIG. 5, each element may be referred to simply by its letter/number label (e.g. MP1, MN1, R1, etc.), but will be describing elements in FIG. 5 not in FIG. 3.

Referring to FIG. 5, R1 502 has a first terminal coupled to a circuit node 526 and a second terminal coupled to a first current electrode of MN1. MN1 has a control electrode coupled to receive Vip and a second current electrode coupled to a circuit node 532. MP1 has a first current electrode coupled to circuit node 532, a control electrode coupled to circuit node 532, and a second current electrode coupled to Vdd. R2 506 has a first terminal coupled to circuit node 526 and a second current electrode coupled to a circuit node 542. In the illustrated embodiment, R1 502 and R2 506 have a same resistance value. MN2 has a first current electrode coupled to circuit node 542, a control electrode coupled to receive Vin, and a second current electrode coupled to a circuit node 536. MP2 has a first current electrode coupled to circuit node 536, a control electrode coupled to circuit node 536, and a second current electrode coupled to Vdd. Circuit node 526 is coupled to receive Ibias_tail, and circuit node 542 is coupled to receive Ibias_hyst.

Still referring to FIG. 5, MN3 has a first current electrode coupled to Vss, a control electrode coupled to a circuit node 534, and a second current electrode coupled to circuit node 534. MP3 has a first current electrode coupled to circuit node 534, a control electrode coupled to circuit node 532, and a second current electrode coupled to Vdd. MN4 has a first current electrode coupled to Vss, a control electrode coupled to circuit node 534, and a second current electrode coupled to a circuit node 530 (also referred to as a combination point of CMP 500). MP4 has a first current electrode coupled to circuit node 530, a control electrode coupled to circuit node 536, and a second current electrode coupled to Vdd. MN5 has a first current electrode coupled to Vss, a control electrode coupled to circuit node 530, and a second current electrode coupled to a circuit node 540. MP5 has a first current electrode coupled to circuit node 540, a control electrode coupled to circuit node 532, and a second current electrode coupled to Vdd. Circuit node 540 provides CMP_out for CMP 500. Note that operation for CMP 500 is analogous to CMP 300, but using complementary elements, as known in the art.

Figure 6:
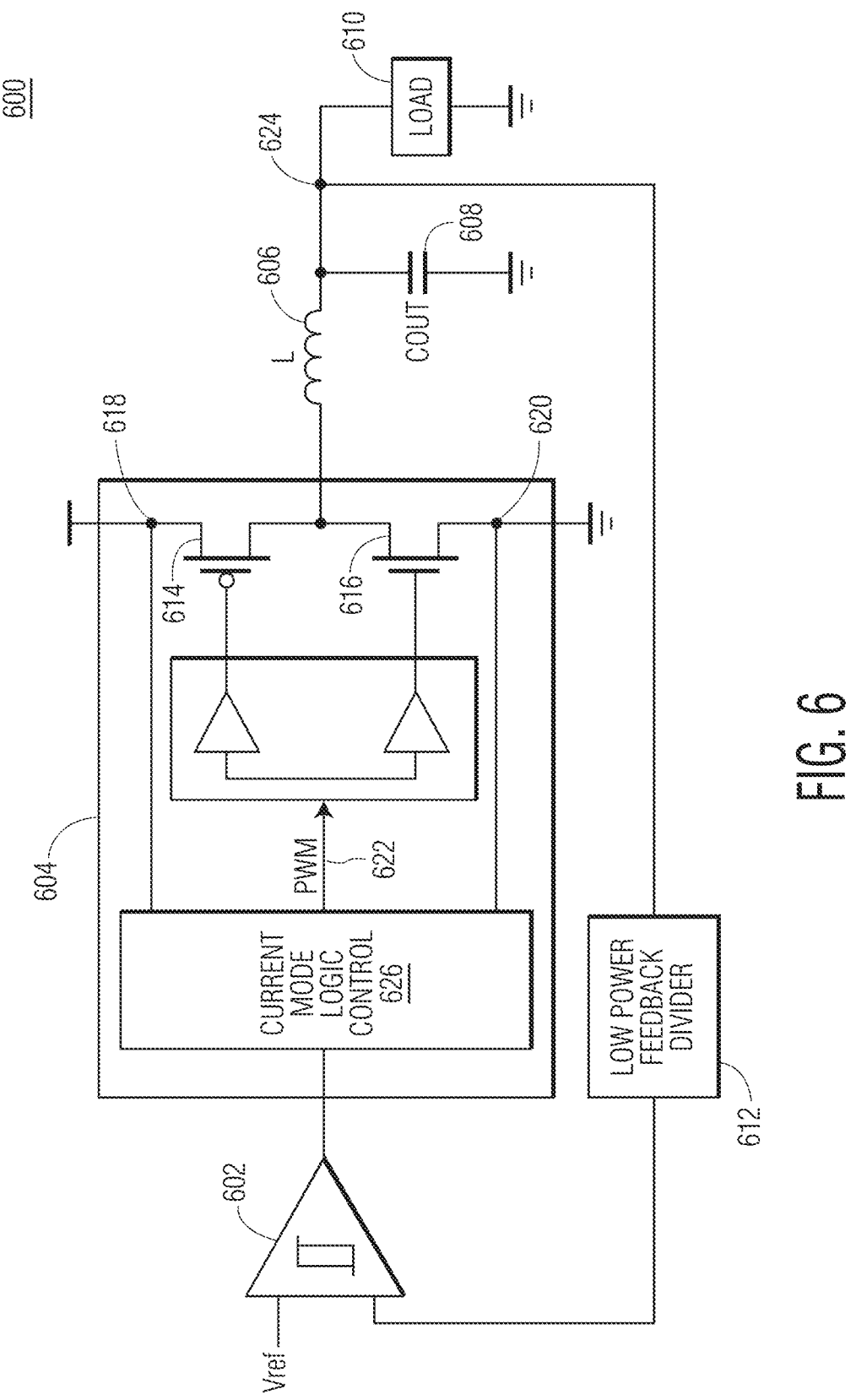
FIG. 6 illustrates a voltage regulator with a hysteretic comparator, in accordance with an embodiment of the present invention.

FIG. 6 illustrates, in block diagram form, a voltage regulator 600 implemented using a hysteretic comparator 602, in accordance with one embodiment of the present invention. In the illustrated embodiment, a DCDC converter 604 is used at the output of comparator 602 (which can be implemented with hysteretic comparator 100 of FIG. 1) to produce a regulator output voltage, Vout, provided via inductor L 606 at circuit node 624 and stored in capacitor C 608 for a load 610. DCDC converter 604 includes a current mode logic control circuit 626 which is configured to receive the outputs (e.g. CMP_out, UV, and OV) from comparator 602 and includes current sensors coupled to receive current inputs from nodes 618 and 620. Control circuit 626 uses its inputs to generate a control signal (e.g. a pulse width modulated signal (PWM) 622) for drivers driving switches 614 and 616 to alternately enable and disable power switches 614 and 616. As a result, Vout is provided at node

624. Comparator 602 receives a reference voltage at its Vip input and a feedback signal from the load voltage via a low power feedback divider 612 at its Vin input. DCDC converter 604, utilizing a switched regulator, operates as known in the art. In alternate embodiments, DCDC converter 604 can be replaced with any switched or linear regulator. Hysteretic comparator 100 can also be used in any other application requiring a comparison with hysteresis.

Therefore, by now it can be understood how a hysteretic comparator can be implemented for a low power application using a single comparator to provide for both a detection of a first threshold and of a second threshold, different than the first threshold (e.g. such as an OV indicator which indicates an OV event or condition when an input voltage has reached a high voltage threshold and a UV indicator which indicates a UV event or condition when the input voltage has reached a low voltage threshold). Further, the detection of one of the thresholds (e.g. to assert the OV indicator to indicate the OV event) may be performed during a monitoring phase in which the hysteretic comparator operates with a lower power consumption using a lower bias current as compared to the detection of the other threshold (e.g. to assert the UV indicator to indicate the UV event) which may be performed in a detection phase in which the hysteretic comparator operates faster but with high power consumption using a higher bias current. The higher bias current is also injected asymmetrically during the detection phase in order to provide the desired hysteresis for the UV indicator. In one embodiment, the UV event indicator is used to control provision of the lower and higher bias currents to the single comparator to implement the lower power and higher power comparison phases (e.g. monitoring and detection phases, respectively). In one aspect, a latch is used to capture the UV and OV indicators based on the output of the single comparator in which the latch is controlled, based on the UV indicator, to steer the output of the single comparator to alternately assert the UV and OV indicators during the monitoring phase and detection phase, respectively. Also, in another aspect, under untrimmed conditions, a trim bias current is used to reduce the hysteresis offset variation.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Also, in one embodiment, the illustrated elements of hysteretic comparator 100 are circuitry located on a single integrated circuit or within a same device (e.g. within a System in a Chip (SoC)).

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different logic circuitry can be use to latch the OV and UV indicators and direct the output of the signal comparator (e.g. CMP_out) to generate the appropriate OV or UV indicator during the appropriate phase of operation. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In an embodiment, a hysteretic comparison circuit includes a comparator configured to receive a first input voltage at a control electrode of a first transistor in a first current branch and a second input voltage at a control electrode of a second transistor in a second current branch, and having an output node configured to provide a single output voltage, the comparator configured to alternately operate in a first phase and a second phase; a latch coupled to receive the single output voltage and configured to latch a first indicator which indicates, during the first phase, an under voltage (UV) event when the first input voltage falls below a first threshold voltage and latch a second indicator which indicates, during the second phase, an over voltage (OV) event when the first input voltage exceeds a second threshold voltage, higher than the first threshold voltage; a first current source configured to provide a first bias current to the comparator during the first phase; and a second current source configured to provide a second bias current, larger than the first bias current, to the comparator during the second phase but not the first phase. In one aspect, the second bias current is selectively provided to the comparator based on a state of the latched first indicator. In another aspect, the hysteretic comparison circuit further includes a third current source configured to provide a third bias current to the comparator based on a trimmed state of the comparator. In a further aspect, when the trimmed state of the comparator is untrimmed, the third bias current is provided to the comparator during the first and second phases. In another further aspect, the second bias current is at least 20 times greater than the first bias current. In another aspect of the above embodiment, the latch is configured to latch assertion of the first indicator in response to the single output voltage of the comparator during the first phase and to latch assertion the second indicator in response to the single output voltage of the comparator during the second phase. In another aspect, the latch is configured to receive a control signal and includes a first SR latch configured to provide the first indicator at a first output of the first SR latch, wherein a set input of the first SR latch is coupled to receive a first logical combination of the single output voltage and the control signal, and a second SR latch configured to provide the second indicator at a first output of the second SR latch, wherein a set input of the second SR latch is coupled to receive a second logical combination of the single output voltage and the control signal, different from the first logical combination. In a further aspect, the control signal is asserted during the second phase in response to asserting the first indicator and is negated during the first phase in response to asserting the second indicator. In another further aspect, a reset input of the first SR latch is coupled to receive an inverse of the second output of the second SR latch; and a reset input of the second SR latch is coupled to receive an inverse of the second output of the first SR latch. In another further aspect, the second logical combination at the set input of the second SR latch prevents the single output voltage from affecting the second indicator during an initial portion of the second phase. In another aspect of the above embodiment, the latch is configured to negate the second indicator in response to asserting the first indicator, and negate the first indicator in response to asserting the second indicator. In a further aspect, the first and second phases are indicated by a state of the latched first indicator. In another aspect, the comparator includes a pair of resistors coupled between first current electrodes of the first and second transistors, wherein a first circuit node is located between the resistors of the pair of resistors and a second circuit node is located between the pair of resistors and the second transistor, and wherein the first bias current is provided to the first circuit node during the first and second phases, and the second bias current is provided to the second circuit node during the second phase. In a further aspect, the second current source is coupled to the second circuit node via a first switch, wherein the first switch is enabled and disabled based on the latched first indicator.

In another embodiment, a hysteretic comparison circuit includes a comparator configured to receive a first input voltage at a control electrode of a first transistor in a first current branch and a second input voltage at a control electrode of a second transistor in a second current branch, and having an output node configured to provide a single output voltage, the comparator configured to alternately operate in a first phase and a second phase; a latch coupled to receive the single output voltage and configured to latch a first indicator which indicates, during the first phase, an under voltage (UV) event when the first input voltage falls below a first threshold voltage and latch a second indicator which indicates, during the second phase, an over voltage (OV) event when the first input voltage exceeds a second threshold voltage, wherein the first and second phases are indicated by a state of the latched first indicator; a first current source coupled to a first circuit node of the comparator, the first circuit node located symmetrically between the first and second current branches, and the first current source configured to provide a first bias current to the first circuit node; and a second current source coupled to a second circuit node of the comparator via a first switch, the second circuit node located asymmetrically between the first and second current branches, and the second current source configured to provide a second bias current, wherein the first switch is selectively enabled by the latched first indicator. In one aspect, the hysteretic comparison circuit further includes a third current source coupled to the first circuit node of the comparator via a second switch, the third current source configured to provide a third bias current, wherein the second switch is selectively enabled by a first control signal, wherein the first control signal indicates whether the comparator is trimmed or untrimmed. In yet a further aspect, the comparator includes a pair of resistors coupled between first current electrodes of the first and second transistors, wherein the first circuit node is located between the resistors of the pair of resistors and the second circuit node is located between the pair of resistors and the second transistor, wherein while the first control signal indicates that the comparator is untrimmed, the second switch is enabled to provide the third bias current to the first circuit node, and wherein the first switch is enabled to provide the second bias current to the second circuit node while the latched first indicator is asserted indicating occurrence of the UV event and not provide any bias current to the second circuit node while the latched first indicator is negated. In a further aspect, the second bias current is at least at least 20 times greater than the first bias current. In another aspect of the another embodiment, the latch is configured to negate the second indicator in response to asserting the first indicator, and negate the first indicator in response to asserting the second indicator. In yet another aspect, the latch is configured to receive a control signal and includes a first SR latch configured to provide the first indicator at a first output of the first SR latch, wherein a set input of the first SR latch is coupled to receive a first logical combination of the single output voltage and the control signal, and a second SR latch configured to provide the second indicator at a first output of the second SR latch, wherein a set input of the second SR latch is coupled to receive a second logical combination of the single output voltage and the control signal, different from the first logical combination. A reset input of the first SR latch is coupled to receive an inverse of the second output of the second SR latch, and a reset input of the second SR latch is coupled to receive an inverse of the second output of the first SR latch.

What is claimed is:

1. A hysteretic comparison circuit, comprising:
   a comparator configured to receive a first input voltage at a control electrode of a first transistor in a first current branch and a second input voltage at a control electrode of a second transistor in a second current branch, and having an output node configured to provide a single output voltage, the comparator configured to alternately operate in a first phase and a second phase;
   a latch coupled to receive the single output voltage and configured to latch a first indicator which indicates, during the first phase, an under voltage (UV) event when the first input voltage falls below a first threshold voltage and latch a second indicator which indicates, during the second phase, an over voltage (OV) event when the first input voltage exceeds a second threshold voltage, higher than the first threshold voltage;
   a first current source configured to provide a first bias current to the comparator during the first phase; and
   a second current source configured to provide a second bias current, larger than the first bias current, to the comparator during the second phase but not the first phase.

2. The hysteretic comparison circuit of claim 1, wherein the second bias current is selectively provided to the comparator based on a state of the latched first indicator.

3. The hysteretic comparison circuit of claim 1, further comprising:
   a third current source configured to provide a third bias current to the comparator based on a trimmed state of the comparator.

4. The hysteretic comparison circuit of claim 3, wherein, when the trimmed state of the comparator is untrimmed, the third bias current is provided to the comparator during the first and second phases.

5. The hysteretic comparison circuit of claim 3, wherein the second bias current is at least 20 times greater than the first bias current.

6. The hysteretic comparison circuit of claim 1, wherein the latch is configured to latch assertion of the first indicator in response to the single output voltage of the comparator during the first phase and to latch assertion the second indicator in response to the single output voltage of the comparator during the second phase.

7. The hysteretic comparison circuit of claim 1, wherein the latch is configured to receive a control signal and comprises:
   a first SR latch configured to provide the first indicator at a first output of the first SR latch, wherein a set input of the first SR latch is coupled to receive a first logical combination of the single output voltage and the control signal, and
   a second SR latch configured to provide the second indicator at a first output of the second SR latch, wherein a set input of the second SR latch is coupled to receive a second logical combination of the single output voltage and the control signal, different from the first logical combination.

8. The hysteretic comparison circuit of claim 7, wherein the control signal is asserted during the second phase in response to asserting the first indicator and is negated during the first phase in response to asserting the second indicator.

9. The hysteretic comparison circuit of claim 7, wherein:
a reset input of the first SR latch is coupled to receive an inverse of the second output of the second SR latch; and
a reset input of the second SR latch is coupled to receive an inverse of the second output of the first SR latch.

10. The hysteretic comparison circuit of claim 7, wherein the second logical combination at the set input of the second SR latch prevents the single output voltage from affecting the second indicator during an initial portion of the second phase.

11. The hysteretic comparison circuit of claim 1, wherein the latch is configured to negate the second indicator in response to asserting the first indicator, and negate the first indicator in response to asserting the second indicator.

12. The hysteretic comparison circuit of claim 11, wherein the first and second phases are indicated by a state of the latched first indicator.

13. The hysteretic comparison circuit of claim 1, wherein the comparator comprises:
a pair of resistors coupled between first current electrodes of the first and second transistors, wherein a first circuit node is located between the resistors of the pair of resistors and a second circuit node is located between the pair of resistors and the second transistor,
wherein the first bias current is provided to the first circuit node during the first and second phases, and the second bias current is provided to the second circuit node during the second phase.

14. The hysteretic comparator circuit of claim 13, wherein the second current source is coupled to the second circuit node via a first switch, wherein the first switch is enabled and disabled based on the latched first indicator.

15. A hysteretic comparison circuit, comprising:
a comparator configured to receive a first input voltage at a control electrode of a first transistor in a first current branch and a second input voltage at a control electrode of a second transistor in a second current branch, and having an output node configured to provide a single output voltage, the comparator configured to alternately operate in a first phase and a second phase;
a latch coupled to receive the single output voltage and configured to latch a first indicator which indicates, during the first phase, an under voltage (UV) event when the first input voltage falls below a first threshold voltage and latch a second indicator which indicates, during the second phase, an over voltage (OV) event when the first input voltage exceeds a second threshold voltage, wherein the first and second phases are indicated by a state of the latched first indicator;
a first current source coupled to a first circuit node of the comparator, the first circuit node located symmetrically between the first and second current branches, and the first current source configured to provide a first bias current to the first circuit node; and a second current source coupled to a second circuit node of the comparator via a first switch, the second circuit node located asymmetrically between the first and second current branches, and the second current source configured to provide a second bias current, wherein the first switch is selectively enabled by the latched first indicator.

16. The hysteretic comparison circuit of claim 15, further comprising:
a third current source coupled to the first circuit node of the comparator via a second switch, the third current source configured to provide a third bias current, wherein the second switch is selectively enabled by a first control signal, wherein the first control signal indicates whether the comparator is trimmed or untrimmed.

17. The hysteretic comparison circuit of claim 16, wherein the comparator comprises:
a pair of resistors coupled between first current electrodes of the first and second transistors, wherein the first circuit node is located between the resistors of the pair of resistors and the second circuit node is located between the pair of resistors and the second transistor,
wherein while the first control signal indicates that the comparator is untrimmed, the second switch is enabled to provide the third bias current to the first circuit node, and
wherein the first switch is enabled to provide the second bias current to the second circuit node while the latched first indicator is asserted indicating occurrence of the UV event and not provide any bias current to the second circuit node while the latched first indicator is negated.

18. The hysteretic comparison circuit of claim 17, wherein the second bias current is at least at least 20 times greater than the first bias current.

19. The hysteretic comparison circuit of claim 15, wherein the latch is configured to negate the second indicator in response to asserting the first indicator, and negate the first indicator in response to asserting the second indicator.

20. The hysteretic comparison circuit of claim 15, wherein the latch is configured to receive a control signal and comprises:
a first SR latch configured to provide the first indicator at a first output of the first SR latch, wherein a set input of the first SR latch is coupled to receive a first logical combination of the single output voltage and the control signal, and
a second SR latch configured to provide the second indicator at a first output of the second SR latch, wherein a set input of the second SR latch is coupled to receive a second logical combination of the single output voltage and the control signal, different from the first logical combination, wherein:
a reset input of the first SR latch is coupled to receive an inverse of the second output of the second SR latch; and
a reset input of the second SR latch is coupled to receive an inverse of the second output of the first SR latch.

* * * * *